United States Patent
Sheth et al.

(10) Patent No.: US 11,250,895 B1
(45) Date of Patent: Feb. 15, 2022

(54) SYSTEMS AND METHODS FOR DRIVING WORDLINES USING SET-RESET LATCHES

(71) Applicant: QUALCOMM Incorporated, San Diego, CA (US)

(72) Inventors: Dhvani Sheth, San Diego, CA (US); Anil Chowdary Kota, San Diego, CA (US); Hochul Lee, Los Angeles, CA (US); Chulmin Jung, San Diego, CA (US); Bin Liang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/089,534

(22) Filed: Nov. 4, 2020

(51) Int. Cl.
  *G11C 8/00* (2006.01)
  *G11C 8/08* (2006.01)
  *G11C 8/10* (2006.01)
  *G11C 16/30* (2006.01)
  *G11C 7/10* (2006.01)
(52) U.S. Cl.
  CPC ............. *G11C 8/08* (2013.01); *G11C 7/106* (2013.01); *G11C 7/1087* (2013.01); *G11C 8/10* (2013.01); *G11C 16/30* (2013.01)

(58) Field of Classification Search
  CPC ........................................................ G11C 8/08
  USPC .................................................... 365/230.06
  See application file for complete search history.

(56) References Cited

U.S. PATENT DOCUMENTS

| | | | |
|---|---|---|---|
| 4,260,062 A * | 4/1981 | Lockett | B07C 5/342 209/582 |
| 6,118,726 A | 9/2000 | Ji et al. | |
| 2009/0185424 A1 * | 7/2009 | Pyeon | G11C 16/08 365/185.12 |

* cited by examiner

*Primary Examiner* — Hoai V Ho
(74) *Attorney, Agent, or Firm* — Haynes and Boone, LLP

(57) ABSTRACT

A memory device including: a first core of memory bitcells; a second core of memory bitcells; pre-decoding circuitry shared by the first core and the second core; and a row decoder coupled to the pre-decoding circuitry, the first core, and the second core, the row decoder including a first set-reset (SR) latch coupled to a first wordline of the first core and a second SR latch coupled to a second wordline of the second core.

28 Claims, 11 Drawing Sheets

SYSTEMS AND METHODS FOR DRIVING WORDLINES USING SET-RESET LATCHES

TECHNICAL FIELD

The present application relates, generally, to row decoders and, more specifically, to row decoders having set reset latches.

BACKGROUND

A conventional computing device (e.g., smart phone, tablet computer, etc.) may include a system on chip (SOC), which has a processor and other operational circuits. The SOC may also include random-access memory (RAM) implemented as static RAM (SRAM), dynamic RAM (DRAM), as well as various read-only memories (ROMs). RAM may be implemented within a processor, such as a central processing unit (CPU), graphics processing unit (GPU), or outside of a processor.

An example of RAM includes a system having two one-sided memories that share an address pre-decoder and a set of row decoders. The address pre-decoder receives addresses for both one-sided memories and pre-decodes those addresses. The pre-decoded signals are then applied to a row decoder to turn on appropriate wordlines. This is true for both reading and writing. Designing a system so that two one-sided memories share an address pre-decoder and a set of row decoders may save physical space on a semiconductor die, by reducing a number of transistors, relative to a system in which each memory has its own address pre-decoder and row decoders. However, sharing an address pre-decoder and row decoders between memories may have drawbacks.

One drawback found in some systems is that the row decoders may each be coupled to a transistor stack through a floating node. The transistor stack may include a pull-down stack that receives pre-decoded signals. Assuming that the row decoders have the capacity for latching the wordlines, then the stability of the circuit may depend upon the relative strengths of the row decoder latches versus the transistor stack. Specifically, if the row decoder latches are weaker than the transistor stack, then allow one or both of the row decoders to undesirably discharge in some instances.

Accordingly, there is a need in the art for RAM row decoders having greater stability while maintaining space-saving advantages from sharing address pre-decoding and row decoding between multiple one-sided memories.

SUMMARY

Various implementations provide systems and methods for driving wordlines using set-reset (SR) latches. One implementation includes the row decoders in a larger memory device having a first memory core and a second memory core sharing the pre-decoding circuitry. Each row decoder may include cross-coupled NOR gates for SR latches. A further refinement of the implementation includes using more compact arrangements of transistors for the SR latches, rather than cross-coupled NOR gates.

According to one implementation, a memory device includes: a first core of memory bitcells; a second core of memory bitcells; pre-decoding circuitry shared by the first core and the second core; and a row decoder coupled to the pre-decoding circuitry, the first core, and the second core, the row decoder including a first set-reset (SR) latch coupled to a first wordline of the first core and a second SR latch coupled to a second wordline of the second core.

According to one implementation, a method performed in a time-sharing memory architecture includes: driving a first wordline in a first core of memory bit cells, including setting a first set-reset (SR) latch by using a first set signal; holding a voltage of the first wordline in an ON state, including applying the voltage of the first wordline to a first transistor in the first SR latch; driving a second wordline in a second core of memory bit cells, including setting a second SR latch by using a second set signal; holding a voltage of the second wordline in the ON state, including applying the voltage of the second wordline to a second transistor in the second SR latch; and subsequent to driving the first wordline, turning off the first wordline by changing a first reset signal of the first SR latch.

According to one implementation, a system on chip (SOC) includes: a time-sharing memory device having a first core of memory bitcells and a second core of memory bitcells; means for converting address bits into pre-decoded signals; and means for receiving the pre-decoded signals and for accessing data in the time-sharing memory device according to the pre-decoded signals, the receiving means comprising an array of row decoders, each row decoder in the array having a first set-reset (SR) latch coupled to the first core and a second SR latch coupled to the second core.

According to one implementation, a system on chip (SOC) includes: a first core of memory bitcells; a second core of memory bitcells; and a plurality of row decoders shared by the first core and the second core, wherein a first row decoder of the plurality of row decoders includes a first set-reset (SR) latch coupled to a first wordline of the first core and a second SR latch coupled to a second wordline of the second core.

DETAILED DESCRIPTION

Various implementations provided herein include systems and methods to drive wordlines in memory devices where memory cores share pre-decoding circuitry. In one example, a memory device includes a first core of memory bit cells and a second core of memory bit cells. The first core and the second core share pre-decoding circuitry. The memory device also includes a set or array of row decoders that are coupled to the pre-decoding circuitry as well as to the first core and the second core. Looking at one of the row decoders, it may include a first set reset (SR) latch coupled to a first wordline of the first core as well as a second SR latch coupled to a second wordline of the second core.

The SR latches may allow the wordlines to be held in an on state for as long as desirable. For instance, a wordline in the first core may be held in an on state after a read or write operation in the first core and during a read or write operation in the second core, thereby allowing the first core and second core to operate in a same clock cycle while sharing the pre-decoding circuitry.

Figure 8A:
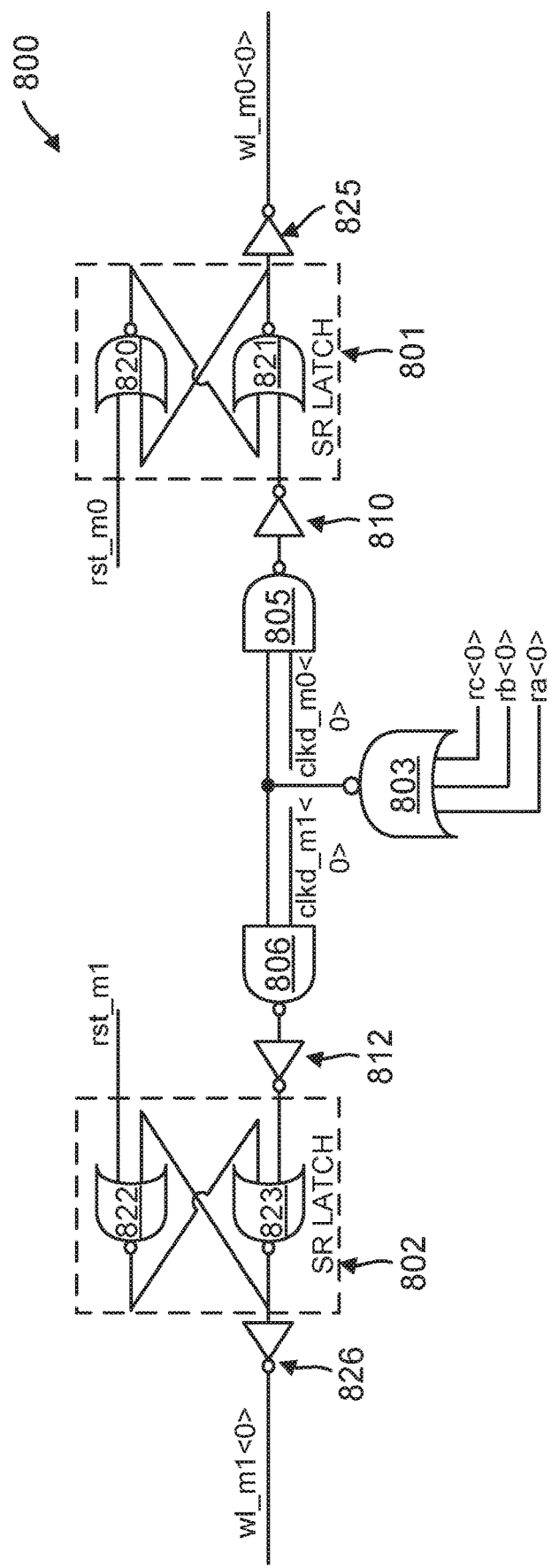
FIGS. 8A and 8B include an illustration of a row decoder using two SR latches, and which may be used in the example memory device of FIG. 1, and a timing diagram, according to one implementation.

Continuing with the example, in some implementations the SR latches may include cross-coupled NOR gates, as in FIG. 8A. Looking at one SR latch, a first one of the NOR gates may have an input for a reset signal, and the second one of the NOR gates may have an input for an inverted set signal. In this example, the reset signal may cause the latch to hold the corresponding wordline in an off position, whereas the set signal may cause the latch to hold the corresponding wordline in an on position. One set of cross-coupled NOR gates may be implemented using sixteen transistors. Sixteen transistors for an SR latch may be appropriate in some implementations, though other implementations may be well served by using a fewer number of transistors for each SR latch.

Figure 2:
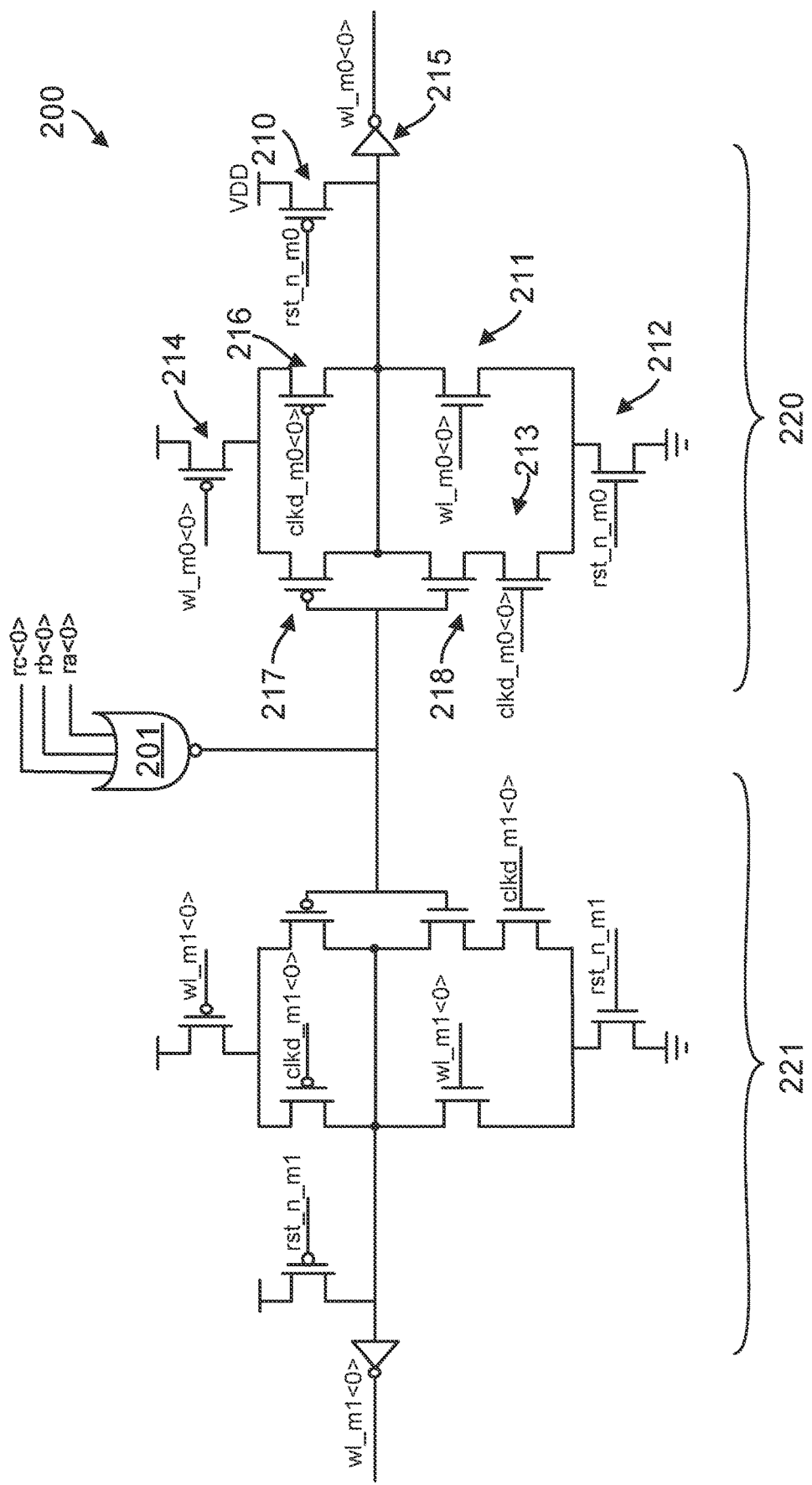
FIG. 2 is an illustration of an example row decoder that may be implemented in the memory device of FIG. 1, according to one implementation.

Thus, another implementation includes each SR latch being implemented with as few as eight transistors, though the scope of implementations is not limited to any particular number of transistors. An example is shown in FIG. 2 in which a reset input may include a pull-up transistor 210 of the SR latch being coupled to the first wordline through a first inverter 215 and being gate-coupled to the reset signal. Thus, if the reset signal is active low, and if the pull-up transistor is a positive channel metal oxide semiconductor (PMOS) device, then a low reset signal may be used to hold the input of the inverter so that the output of the inverter on the wordline is low, thereby holding the wordline in an off state. When a memory core is selected for read or write operation, the reset signal is shifted to logic level high, so that the appropriate wordlines can be asserted based on the address inputs.

Continuing with the example, the SR latch may also include a pull-down transistor (e.g., 213 of FIG. 2) coupled to a set signal. If the set signal is active high, and if the pull-down transistor is a negative channel metal oxide semiconductor (NMOS) device, then the set signal may be used to pull-down the input to the inverter, thereby causing the wordline to achieve an on state. In one example, the set signal is pulsed so that it is high for a short time relative to the clock cycle. This example, including the pre-decoded signals and initial condition of the rest signal, is discussed in more detail below with respect to FIG. 2.

Furthermore, the example implementation may include another transistor 211 gate-coupled to the wordline. When the wordline is asserted, that may turn the transistor on and pull down the input to the inverter, thereby holding the wordline in an on state. The wordline may be returned to an off state by asserting the active low reset signal.

Of course, the examples above describe only one SR latch. Various implementations include an SR latch for each wordline in each memory core. For instance, one example may include two memory cores each having 512 wordlines, so that each row decoder would have 512 SR latches to drive its wordlines for one core and another 512 SR latches to drive its wordlines for another core. These numbers are for example only, and the scope of implementations may be scaled to any appropriate number of wordlines.

Various implementations may also include methods. An example method includes driving a first wordline in a first core of memory bit cells, including setting a first SR latch. The method may also include holding a voltage of the first wordline in an on state, including applying the voltage of the first wordline to a transistor in the first SR latch. The method may further include driving a second wordline in a second core of memory bit cells, such as by setting a second SR latch. Subsequent to driving the wordline, the method may further include turning off the first wordline by changing a first reset signal in the first SR latch. Additional actions may include turning off the second wordline by changing a second reset signal of the second SR latch.

Various implementations may include advantages over other systems. One advantage includes additional stability compared to prior implementations that use a floating node between a stack of NMOS transistors and a latch. For example, various implementations have complementary pull-up and pull-down portions to avoid charge sharing. The complementary pull-up and pull-down may avoid accidental selection of a wordline. Additionally, using the voltage of the wordline when it is high to maintain a state of the latch may further contribute to stability of the wordline by avoiding accidental turn off.

Furthermore, various implementations also reduce a number of transistors by implementing an SR latch using as few as eight transistors. Reducing a number of transistors may reduce an amount of silicon area, thereby gaining a cost and size advantage over larger-sized row decoders. Reducing a number of transistors may also reduce leakage power and dynamic power, thereby gaining a power saving advantage over larger-sized row decoders.

Yet another advantage may include using a reset signal that is zero by default. Such reset signal may prevent power loss from leakage by having the reset signal at zero (lower voltage) for more time than it is at one (higher voltage).

Figure 1:
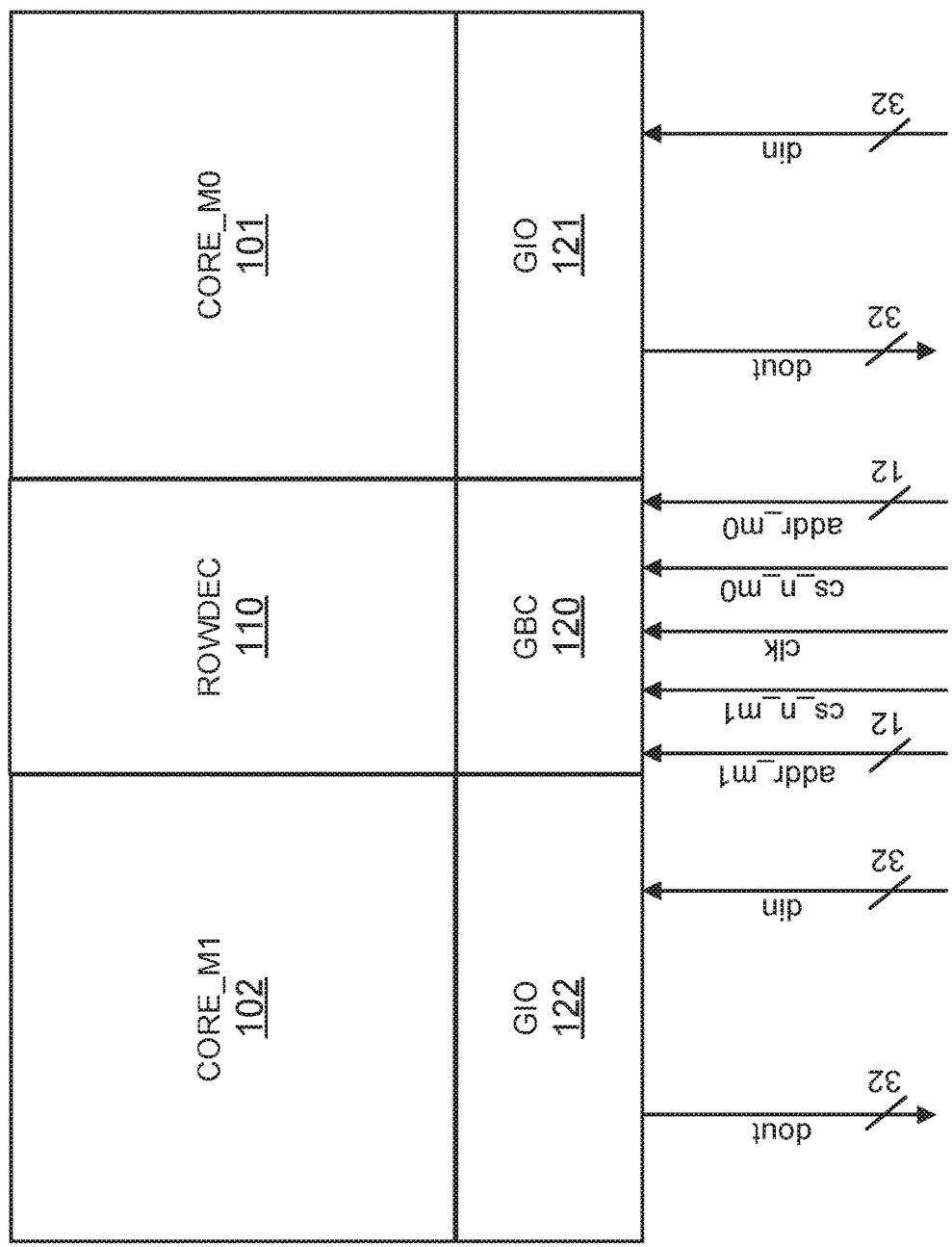
FIG. 1 is a simplified diagram illustrating an example memory device with two memory cores, according to one implementation.

FIG. 1 is a simplified diagram illustrating an example memory device 100 for, according to one implementation. Memory device 100 includes two memory cores 101, 102. The memory cores 101, 102 include a multitude of memory bit cells arranged into rows (words) and columns (bits). The scope of implementations is not limited to any size for the memory cores 101, 102, as any appropriate size memory core may be adapted according to the principles described herein.

Memory device 100 also includes global input output (GIO) 121, 122. The global input outputs 121, 122 provide data paths into and out of the memory device 100 for both read operations and write operations. In this example, each of the memory cores 101, 102 are shown with 32 input data paths and 32 output data paths, though the scope of implementations may include a number of data paths scaled as appropriate.

Global block controller (GBC) 120 receives control instructions and addresses, pre-decodes those addresses, and controls the array of row decoders 110 to access particular wordlines within the memory cores 101, 102 for both read and write access. In the example shown, addr_m0 and addr_m1 are both address signals that are indexed by the particular core (m0 or m1) to which they apply. In this example, each of the address signals is 12 bits, though the scope of implementations may include any number of address bits. The signal clk is a main clock for the memory device 100. The signals cs_n_m0 and cs_n_m1 act as core select signals and determine whether a respective core 101, 102 is to be read from or written to or not acted upon at all.

The set of row decoders 110 includes a multitude of individual row decoders, which are selected by pre-decoded signals (not shown) output from the GBC 120. Various implementations include row decoders that include SR latches for increased stability, as described in more detail below. In the example herein, memory device 100 includes a time-sharing memory architecture in which the cores 101, 102 are read from or written to during a same cycle of the clock signal clk. As explained in more detail below with respect to FIG. 7, the set of row decoders 110 includes a multitude of selectable row decoders in which a wordline with a first index may be selected within core 101 and a wordline with a second (the same or different) index may be selected within core 102.

Reference is now made to FIG. 2, which is a simplified diagram of an individual row decoder 200, according to one implementation. Example row decoder 200 may be included within the set of row decoders 110 of the memory device 100 of FIG. 1. Put another way, row decoder 200 is an example of a row decoder that may be implemented as one of many row decoders within the set of row decoders 110 to select from a multitude of wordlines in both cores 101, 102.

Row decoder 200 includes two SR latches 220, 221. SR latches 220, 221 are coupled to a NOR gate 201, which outputs a digital one when each of the pre-decoded signals ra, rb, rc is zero. The pre-decoded signals are explained in more detail below, and they are used to select and turn on the row decoder 200 so that either or both of the wordlines w1_m0<0> and w1_m1<0> may be turned on for a read or write operation. The pre-decoded signals in this example are active low and, thus, when all three pre-decoded signals ra, rb, rc are at digital zero, then the row decoder 200 is selected.

The following example looks at SR latch 220, which corresponds to a single wordline within core 101. It is understood that SR latch 221, which corresponds to a single wordline within core 102, is constructed in the same way, operates in the same way, and is independently selectable using its own set and reset signals. SR latch 220 in this example is implemented using eight transistors, which is half that of a similarly performing SR latch made of cross-coupled NOR gates. SR latch 220 assumes a digital zero output in response to the reset signal (rst_n_m0) and assumes a digital one output in response to the set signal (clkd_m0<0>), and that set-reset functionality is used in this example to turn on and off the wordline w1_m0_<0>.

NOR gate 201 outputs a digital one if all inputs (pre-decoded signals ra, rb, rc) are zero. Otherwise, the output or NOR gate 201 is a digital zero. When all inputs are zero, transistors 217 and 218, which are gate-coupled to NOR gate 201, receive digital ones at their gates. Transistor 218 is a negative channel metal oxide semiconductor (NMOS) device, and it turns on. Transistor 217 is a positive channel metal oxide semiconductor (PMOS) device, and it turns off. Both transistor 217 and 218 are either source-coupled or drain-coupled to the input of inverter 215.

Transistor 210 is a PMOS device used as a pull-up transistor in this example. Transistor 210 is gate-coupled to the reset signal rst_n_m0, which is an active low reset signal. Therefore, when the reset signal is low, transistor 210 is turned on and applies the power rail voltage to the input of the inverter 215. The inverter 215, when receiving a high voltage, causes the wordline w1_m0<0> to be turned off. Off is the default state for the wordline when it is not reading or writing of value in the memory core 101.

A read or write operation begins by making the reset signal go high, which turns off transistor 210 so that a low voltage or digital zero may be applied to the input of the inverter 215. The signal clkd_m0<0> is used as a set signal, and it may be pulsed to cause a low voltage to appear at the input of the inverter 215 by turning on NMOS device 213 and turning off PMOS device 216. Furthermore, when the reset signal is high, it turns on transistor 212, which couples pull-down transistor 213 to ground. Once the wordline is turned on, it's value is applied to the gates of transistors 211 and 214. A digital one value of the wordline turns off transistor 214 and turns on transistor 211, which acts as a pull-down transistor to keep a low voltage at the input of inverter 215. The wordline may be turned off by changing the value of the reset signal back to a digital zero, thereby turning on transistor 210 and turning off transistor 212.

Figure 3:
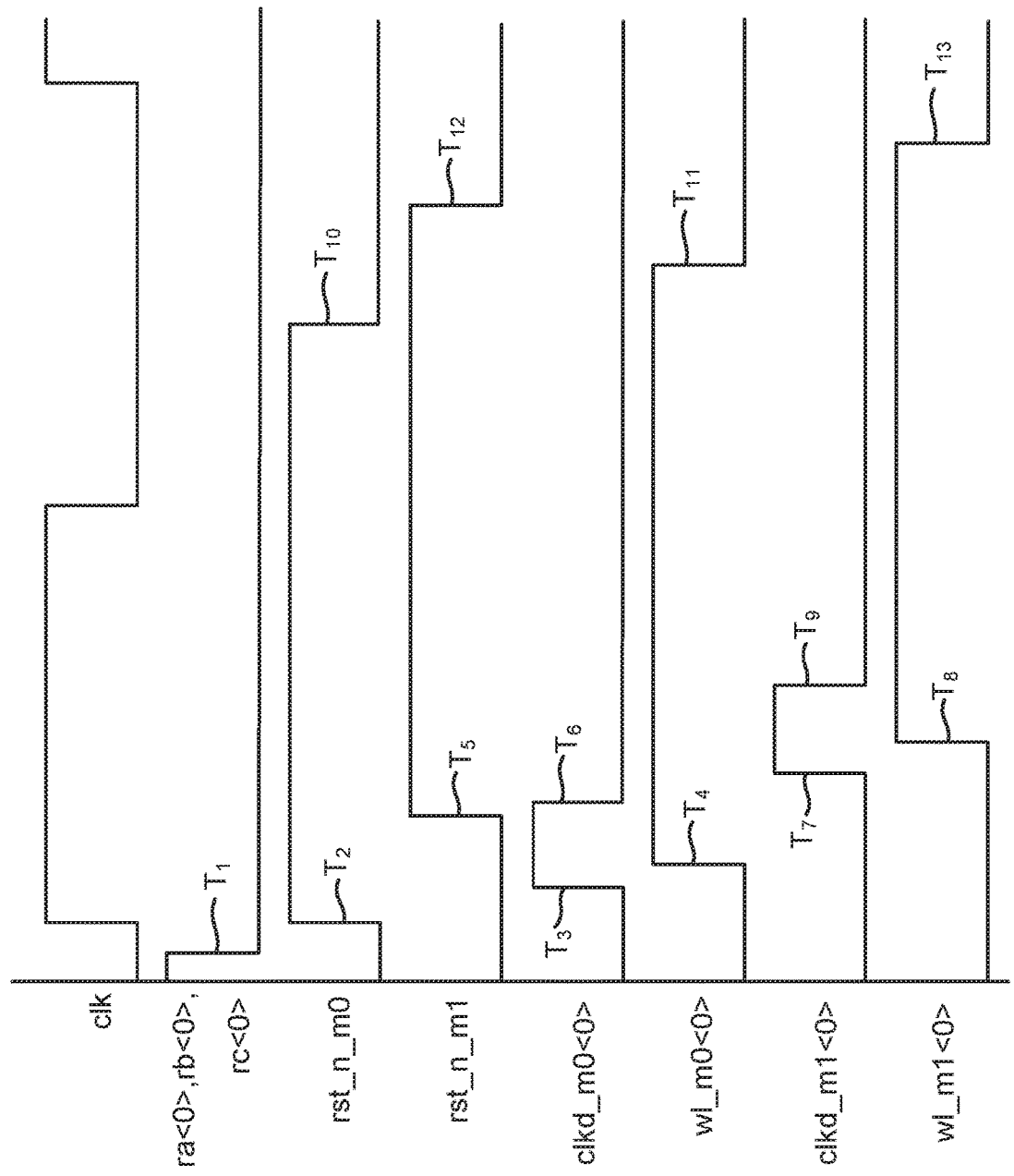
FIG. 3 is a timing diagram of operation of the example row decoder of FIG. 2, according to the implementation of FIG. 2.

A read or write operation, from the standpoint of SR latches 220 and 221, is described in more detail with respect to the timing diagram of FIG. 3. Within FIG. 3, times T1-T13 are provided to illustrate signal transitions. The pre-decoded signals ra, rb, rc start out high and then go low at time T1 to select the row decoder 200 by causing NOR gate 201 to output a digital 1. The reset signals rst_n_m0 and rst_n_m1 both start off low, and the reset signal corresponding to memory core 101 (rst_n_m0) goes high first at time T2, which uncouples the input of the inverter 215 from the power rail by turning off transistor 210. Following that, the set signal clkd_m0 is pulsed at time T3, which turns on transistor 213 and couples the input of the inverter 215 to ground, causing the wordline w1_m0<0> in memory core 101 to turn on at time T4. Transistor 211 is gate-coupled to the wordline, which holds the wordline in an on state even after the set signal clkd_m0<0> is removed at time T6, until the reset signal rst_n_m0 is changed at time T10.

Within the same clock cycle of clk, the reset signal rst_n_m1 corresponding to memory core 102 goes high at time T5, and the set signal clkd_m1 is pulsed from time T7 to time T9, thereby causing the wordline w1_m1<0> in the memory core 102 to go high at time T8. Turning on the wordline w1_m1<0>, corresponding to memory core 102 and SR latch 221, is similar to the actions given above to turn on wordline w1_m0<0>. Specifically, SR latch 221 has the same architecture as SR latch 220, and components corresponding to 210-218 are turned on or off in the same way as at SR latch 221.

At this point, both wordlines w1_m0<0> and w1_m1<0> are turned on, thereby allowing bit cells to be read or written within both of the memory cores 101, 102. Before the clock cycle is over, both SR latches 220 and 221 are reset to cause the wordlines w1_m0<0> and w1_m1<0> to turn off. The SR latches 220 and 221 are reset by making the reset signals rst_n_m0 and rst_n_m1 change value from one back to zero at times T10 and T12. Looking at FIG. 2, when the reset signals go back to zero this causes transistor 210 to turn on and causes transistor 212 to turn off. Both wordlines w1_m0<0> and w1_m1<0> to turn off turn off at times T11 and T13, respectively.

The example of FIG. 3 is a simplified example in which both SR latches 220, 221 are set and reset within the same clock cycle, which assumes that read or write operations are performed at corresponding wordline indexes in both memory core 101 and memory core 102. However, various implementations allow the memory cores 101, 102 to be addressed independently so that differently indexed wordlines (and, thus, differently indexed row decoders) are selected within the same clock cycle. This is illustrated in more detail below with respect to FIG. 7.

Figure 4:
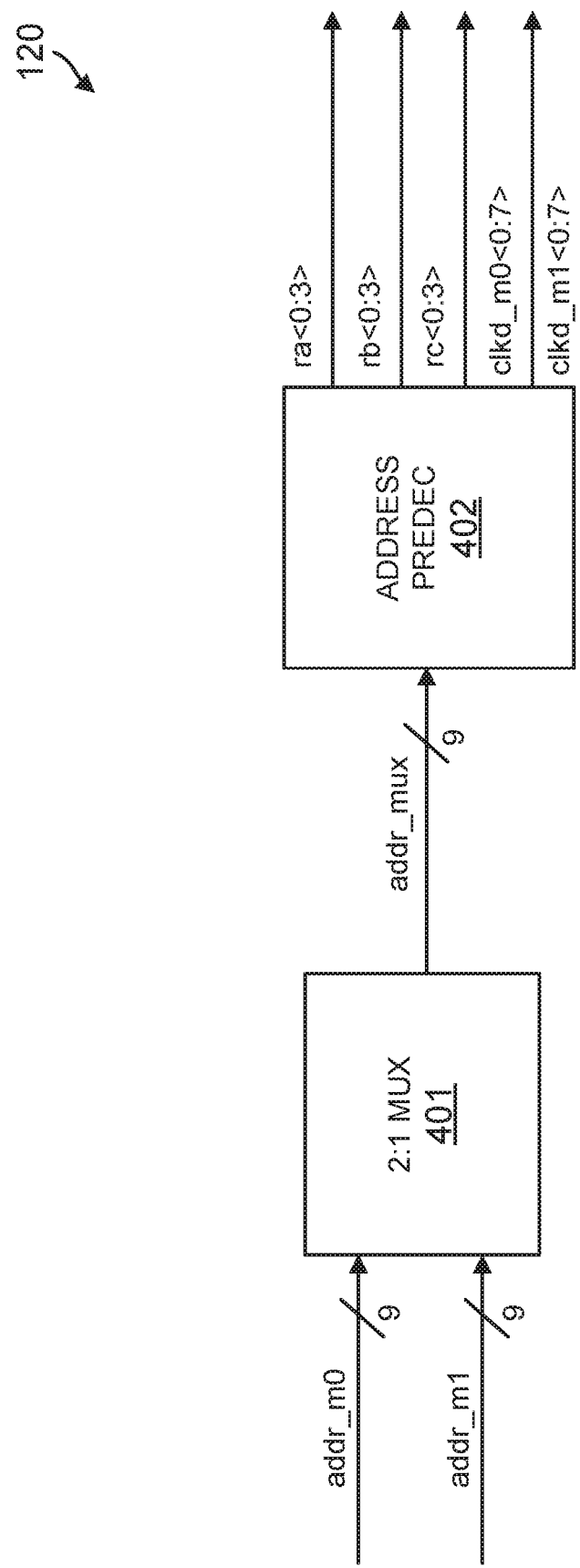
FIG. 4 is an illustration of an example global block controller (GBC) for use in the implementation of FIG. 1 to control a row decoder, such as is illustrated in FIGS. 2, 6, and 8.

Moving to FIG. 4, it is an illustration of an example GBC 120, according to one implementation. GBC 120 in this example receives address signals addr_m0 and addr_m1 for each of memory cores 101, 102 respectively. In this example, the address signals are shown as both including nine bits, though the scope of implementations may include any appropriate number of address bits to realize an addressing scheme, according to the number of bit cells and wordlines for a given memory core.

Each of the memory cores 101, 102 are individually selectable and are multiplexed by multiplexor 401. For a given address signal that is multiplexed, it is received by the address pre-decoder 402, which converts the address signal into a set of pre-decoded signals that are used to turn on a particular SR latch corresponding to a particular wordline in a respective memory core. In other words, pre-decoding converts an address signal from an address domain used by a CPU or GPU into an identifiable wordline in a memory core. For instance, ra, rb, rc are fanned out to a multitude of different NOR gates, such as NOR gate 201 of FIG. 2. Each of the signals ra, rb, rc in this example includes four parallel bits, indexed as <0:3>. As described above, when three of the inputs to a given NOR gate are low, then that turns on the corresponding row decoder(s). Each of the set signals clkd_m0 and clkd_m1 include eight parallel bits, indexed as <0:7>.

Address pre-decoder 402 also generates set signals clkd_m0 and clkd_m1. In an example use case, the address signal for the memory core 101 (addr_m0) is sent by multiplexor 401 to address pre-decoder 402 first. Address pre-decoder 402 then generates ra, rb, rc signals and set signal clkd_m0 to turn on a particular wordline at memory core 101. Following that, the address signal for the memory core 102 (addr_m1) is sent by multiplexor 401 to address pre-decoder 402, which generates new ra, rb, rc signals and the set signal clkd_m1 to turn on a particular wordline at memory core 102. This process may be repeated each time there is a read or a write operation, perhaps even at each clock cycle.

Although not shown in FIG. 4, GBC 120 may also include logic and circuits to generate any appropriate signals to control read and write operations of the cores 101, 102. For instance, GBC 120 may also include logic and circuits to generate the various reset signals that are described herein.

Figure 5:
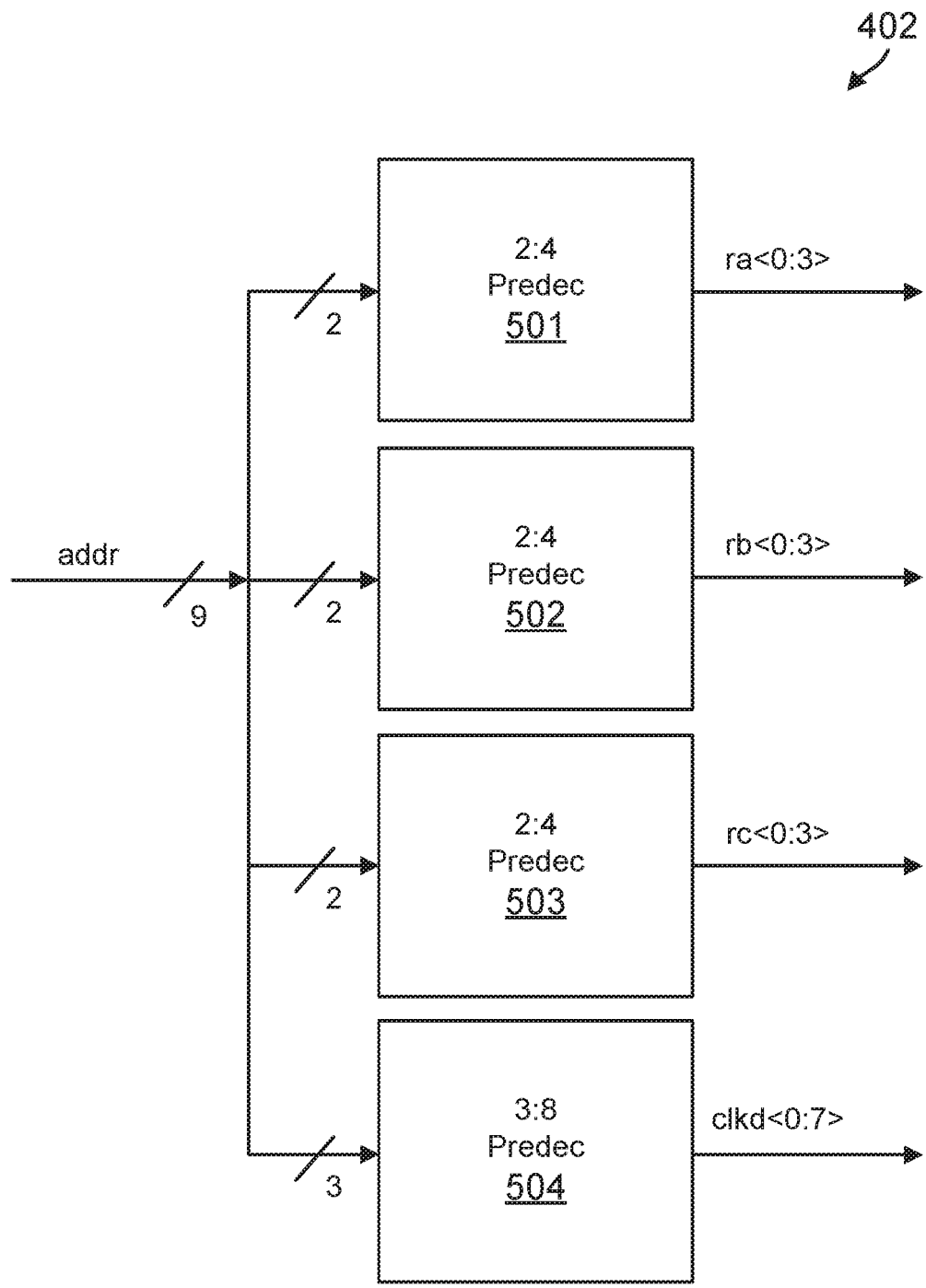
FIG. 5 is an illustration of an example address pre-decoder, adapted according to one implementation.

FIG. 5 is an illustration of example address pre-decoder 402, according to one implementation. In this example, the address pre-decoder 402 includes four individual pre-decoders 501-504. A given address is converted into four ra bits, four rb bits, four rc bits, and eight set (clkd) bits from a nine-bit address signal. However, the scope of implementations is not limited to any particular number of pre-decoding bits or address bits. In one implementation, pre-decoders 501-504 include hardware logic to provide for faster operation than would be expected with software logic.

Figure 6:
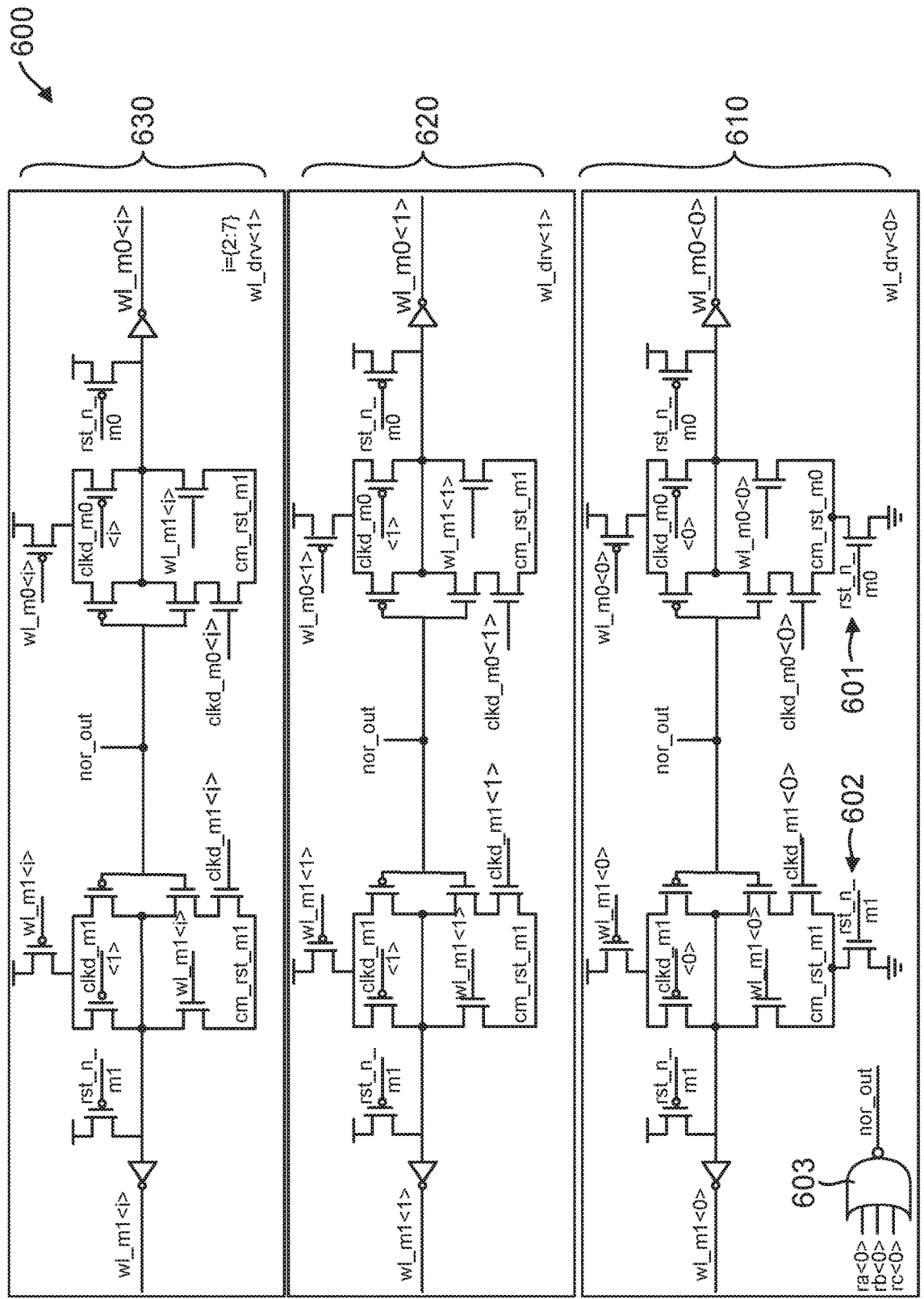
FIG. 6 is an illustration of an example scaling up of the row decoder of FIG. 2 so that multiple row decoders are included within a same memory device, such as the example memory device of FIG. 1, according to one implementation.

FIG. 6 is an illustration of an example set 600 of row decoders, according to one implementation. Looking at row decoder 610 first, it conforms to the architecture described above with respect to FIG. 2 by including two SR latches, which are each configured using eight transistors. Row decoder 620 is substantially similar to row decoder 610, though it omits transistors 601, 602 and instead is coupled to a common ground cm_rst_m0 and cm_rst_m1. The omission of transistors 601, 602 allows for space savings compared to implementations that would otherwise include those transistors.

Row decoder 630 is a composite of six different row decoders having indexes {2:7}, whereas row decoder 610 includes index 0, and row decoder 620 includes index 1. The six different row decoders are represented by row decoder 630 for ease of illustration, and it is understood that when drawn out, each subsequent row decoder having a subsequent index would be laid out moving in the vertical direction to have eight total row decoders. In this example, the eight total row decoders 610-630 share a same ra, rb, rc space so that they are each turned on by the common NOR gate 603 when that set of ra, rb, rc is all zeros. Within that group of eight total row decoders, an individual wordline may be turned on and off by a respective set signal clkd indexed to either memory core 101 (m0) or memory core 102 (m1) and sub index <i>, where <i> has a value in the range {0:7}.

Continuing with the example of FIG. 6, it illustrates only a portion of a row decoder set, such as row decoder set 110 of FIG. 1. A given row decoder set may have as many row decoders as wordlines. So, for example, if a row decoder set supports 512 wordlines, that would include 512 individual row decoders, according to one implementation. The additional row decoders (not shown) may be located using a different ra, rb, rc space. For instance, the ra, rb, rc space of FIG. 6 corresponds to ra<0>, rb<0>, rc<0>, and a next ra, rb, rc may correspond to ra<0>, rb<0>, rc<1> and on and on until ra<3>, rb<3>, rc<3>. In other words, there may be as many ra, rb, rc spaces as there are permutations of the bits of the ra, rb, rc signals. Individual wordlines may be accessed using the pre-decoded signals described above with respect to FIGS. 4-5.

Figure 7:
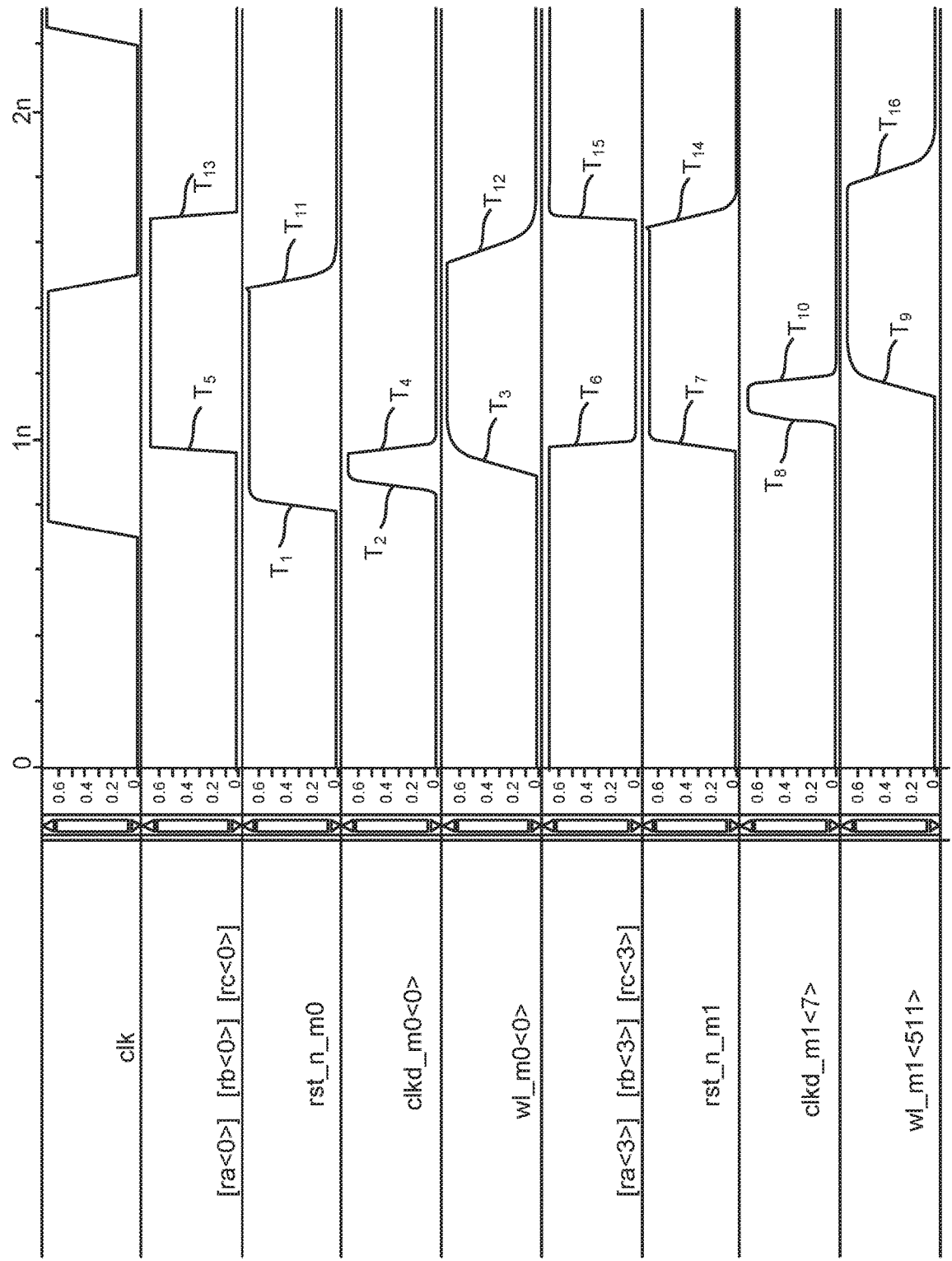
FIG. 7 is an illustration of an example timing diagram for use with an example scaled up memory device having multiple row decoders, according to one implementation.

FIG. 7 is an example timing diagram for use of the set 600 of row decoders in FIG. 6, according to one implementation. The actions of FIG. 7 can be adapted generally to a memory device 100 as shown in FIG. 1. In the example of FIG. 7, two different row decoders are used to turn on two different wordlines, having different indices, for the first and second memory cores. FIG. 7 labels times T1-T16 to illustrate signal transitions.

The actions of FIG. 7 start with accessing wordline w1_m0<0> in a first memory core m0, such as memory core 101. Wordline w1_m0<0> is illustrated in FIG. 6 as coupled to row decoder 610. The reset signal corresponding to the first memory core (rst_n_m0) is changed from a digital zero to a digital one at time T1, and the set signal corresponding to row decoder 610 and the first memory core (clkd_m0<0>) is then pulsed from time T2 to time T4. During this time, signals ra<0>, rb<0>, rc<0> are all zero, and they are set to all ones at time T5, which is subsequent to the set signal pulse, until time T13 after the reset signal is changed back to zero at time T11.

Pulsing the set signal causes the wordline w1_m0<0> to turn on at time T3, and it is held in an on state by being gate-coupled to a pull-down transistor, as discussed in more detail above with respect to FIG. 2. In the same clock cycle, a wordline in a second memory core, such as memory core 102, is also turned on. The wordline in the second memory core (w1_m1<511>) is located using different bits for ra, rb, rc and a set signal with an appropriate index. The wordline in the second memory core is not illustrated in FIG. 6, but it is understood that the memory structure may be scaled. Specifically, in this example, the wordline is located using the pre-decoded signals ra<3>, rb<3>, rc<3> and clkd_m1<7> at times T6 and T8. Similar to the actions of the first wordline, the appropriate reset signal (rst_n_m1) is changed from a digital zero to a digital one at time T7, and the appropriate set signal (clkd_m1<7>) is then pulsed from time T8 to time T10, which causes the wordline w1_m1<511> to turn on at time T9. During this time, the wordline in the first memory core remains on until time T12. The wordline in the second memory core remains on until time T16. Subsequent to these read/write actions in the first memory core and the second memory core, both of the reset signals are then changed from a digital one back to a digital zero at times T11 and T14 (respectively), which turns off both of the wordlines. The pre-decoded signals ra, rb, rc for the first core and the second core transition at times T13 and T15, respectively.

As discussed above with respect to FIG. 1, a given row decoder includes two different SR latches that are each configured using eight different transistors. However, the scope of implementations is not limited to any particular number or arrangement of transistors, as illustrated by FIG. 8.

FIG. 8A is an illustration of an example row decoder 800, adapted according to one implementation. Row decoder 800 is configured using SR latches having sets of cross-coupled NOR gates 801, 802. Looking at cross-coupled NOR gates 801, a first NOR gate 820 receives the reset signal (rst_m0) and a second NOR gate 821 receives a signal that is derived from the set signal (clkd_m0<0>). Specifically, the reset signal is received by the NAND gate 805, where the other input to the NAND gate 805 is the output of NOR gate 803. NOR gate 803 operates similarly to NOR gate 603 in FIG. 6, described above. The output of the NAND gate 805 is applied to the input of inverter 810, and the output of inverter 810 is applied as an input to NOR gate 821.

Now looking to cross-coupled NOR gates 802, it is similar to cross-coupled NOR gates 801. A first NOR gate 822 receives the reset signal (rst_m1) and a second NOR gate 823 receives a signal that is derived from the set signal (clkd_m1<0>). In this example, the reset signal is received by the NAND gate 806, where the other input to the NAND gate 806 is the output of NOR gate 803. The output of the NAND gate 806 is applied to the input of inverter 812, and the output of inverter 812 is applied as an input to NOR gate 823.

Figure 8B:
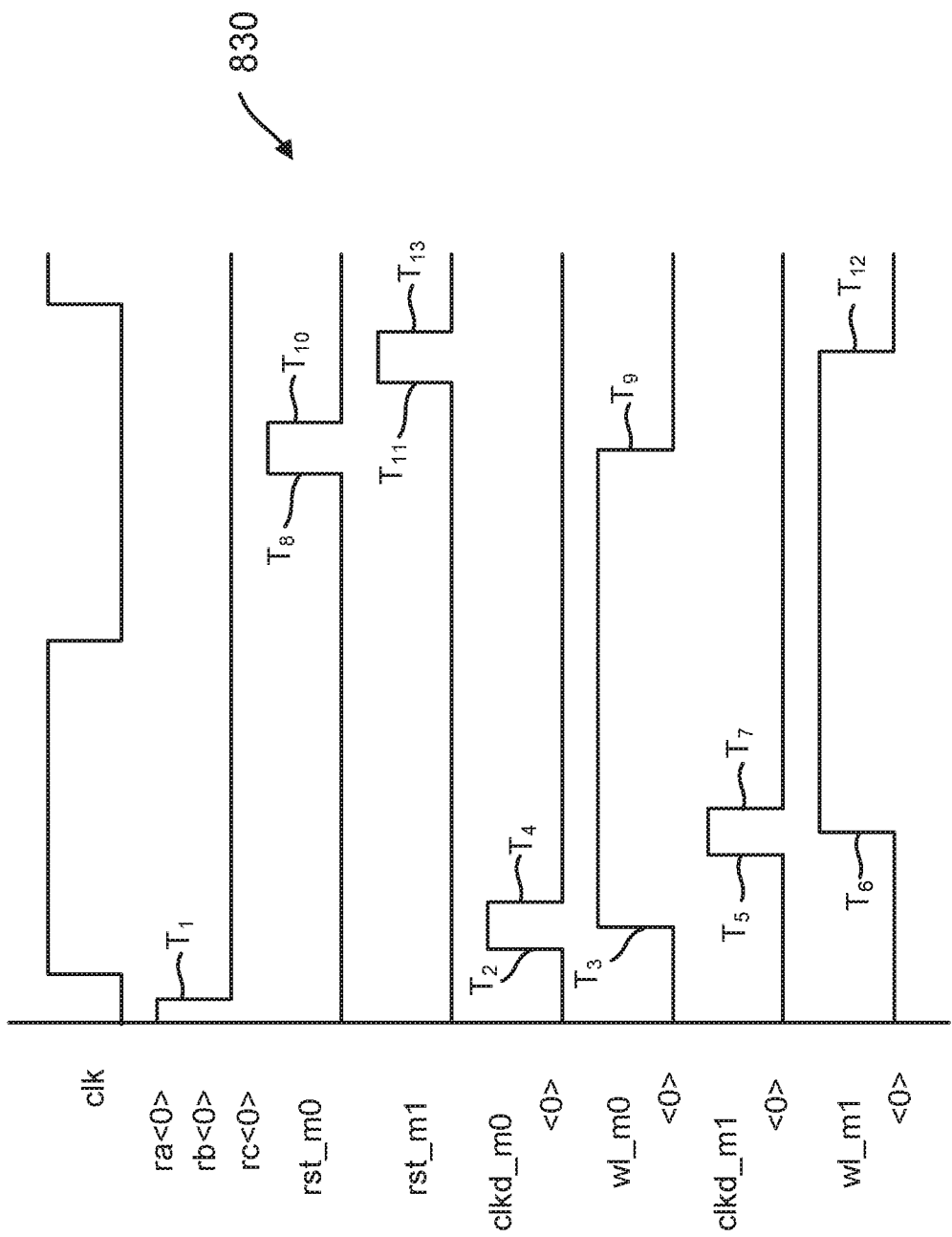

FIG. 8B includes timing diagram 830, which illustrates how the example implementation of FIG. 8A may operate to select both wordlines w1_m0<0> and w1_m1<0> in a single clock cycle. Of course, it is understood that row decoder 800 may be one of many row decoders replicated within a set of row decoders to access two different memory cores. For instance, row decoder 800 may be replicated, such as discussed above with respect to FIGS. 6 and 7. In this example, the wordlines with the same index are selected in the timing diagram 830, and in an example in which row decoder 800 is replicated, wordlines with different indexes may be selected within the same clock cycle, such as in the example of FIG. 7.

The pre-decoded signals ra<0>, rb<0>, rc<0> are all low after time T1, which causes row decoder 800 to be selected. Furthermore, each of the wordlines start in an off state at the beginning of a clock cycle, which is caused by the inputs to each of the inverters 825, 826 being high. The reset signals remain low until it is time to reset the wordlines toward the end of the clock cycle.

When the set signal (clkd_m0<0>) is pulsed from time T2 to T4, it causes the wordline w1_m0<0> to turn on at time T3 because the input to the inverter 825 is low. The on state of the wordline w1_m0<0> is maintained until time T9 by the SR latch with cross-coupled NOR gates 801. During the interval from time T3 to time T9 that the wordline w1_m0<0> is on, the other set signal clkd_m1<0> is pulsed from time T5 to time T7, which causes the wordline w1_m1<0> to turn on at time T6 by providing a low signal to the input of inverter 826. From time T6 to time T9, both of the wordlines w1_m0<0> and w1_m1<0> are in an on state.

Toward the end of the clock cycle, rst_m0 is pulsed from time T8 to time T10, thereby causing wordline w1_m0<0> to return to an off state at time T9. The reset signal rst_m1 is then pulsed from time T11 to time T13, so that wordline w1_m1<0> returns to an off state as well at time T12.

Various implementations may include one or more advantages over other systems. For instance, the row decoders shown in both FIGS. 2 and 8A are stable when the wordlines are in an off state or in an on state. Looking at the implementation of FIG. 2, its arrangement of transistors has complementary pull-up and pull-down portions that do not share charge, thereby avoiding risk that a wordline may be selected unintentionally by one transistor overpowering another during an off state. Also, the arrangement shown in FIG. 2 uses the voltage on a wordline, when that wordline is on, to hold the SR latch, thereby providing stability during an on state of the wordline.

Furthermore, while both the implementations of FIGS. 2 and 8A are stable, the implementation of FIG. 2 may be more efficient than the implementation of FIG. 8A by virtue of reducing a number of transistors in the SR latches. A reduced number of transistors may provide the benefit of reducing an amount of silicon area occupied by the SR latches as well as reducing leakage and dynamic power when compared to implementations using a larger number of transistors.

Various implementations described herein may be suitable for use in a system on chip (SOC). An example of a SOC includes a semiconductor chip having multiple processing devices within it, including a graphics processing unit (GPU), a central processing unit (CPU), a modem unit, a camera unit, and the like. In some examples, the SOC may be included within a chip package, mounted on a printed circuit board, and disposed within a portable device, such as a smart phone or tablet computer. However, the scope of implementations is not limited to a chip implemented within a tablet computer or smart phone, as other applications are possible.

Figure 9:
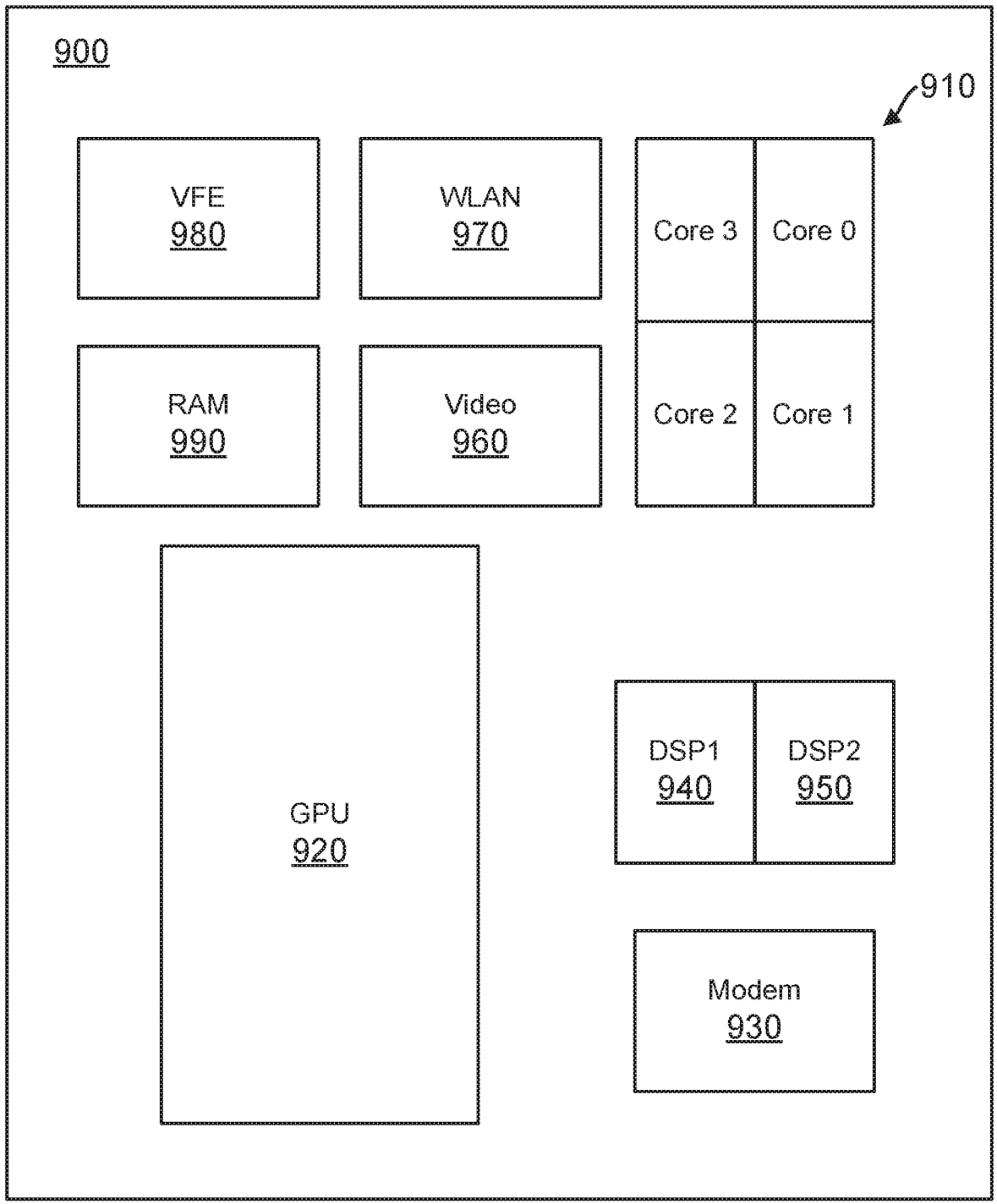
FIG. 9 is an illustration of an example system on chip (SOC), in which may be built memory device having row decoders, such as those illustrated in FIGS. 2, 6, and 8, according to one implementation

FIG. 9 is an illustration of example SOC 900, according to one implementation. In this example, SOC 900 is implemented on a semiconductor die, and it includes multiple system components 910-990. Specifically, in this example, SOC 900 includes CPU 910 that is a multi-core general-purpose processor having four processor cores, core 0-core 3. Of course, the scope of implementations is not limited to any particular number of cores, as other implementations may include two cores, eight cores, or any other appropriate number of cores in the CPU 910. SOC 900 further includes other system components, such as a first digital signal processor (DSP) 940, a second DSP 950, a modem 930, GPU 920, a video subsystem 960, a wireless local area network (WLAN) transceiver 970, and a video-front-end (VFE) subsystem 980.

SOC 900 also includes RAM memory unit 990. In this example, RAM memory unit 990 may include one or more memory devices that correspond to the architectures described above with respect to FIG. 1. The implementations described herein may be adapted for use in any RAM memory unit or Read Only Memory (ROM) memory unit. For instance, in this SOC example, cache RAM (not shown) within a CPU core 0-3 may be adapted to include the row decoders described herein. Further, an example SOC may include standalone RAM memory unit 990 or ROM components and/or RAM or ROM components in other processing units, such as GPU 920, modem unit 130, DSPs 140, 150, or the like. Those RAM or ROM units may also be adapted to use row decoders as described herein.

As noted above, SOC 900 may include a CPU 910 having multiple cores 0-3, and one or more of those cores may execute computer-readable code providing the functionality of an operating system kernel. Furthermore, the example operating system kernel may include memory management software that may perform read and write operations on various memory units, where those memory units may include row decoders as described herein. Accordingly, the principles described above with respect to FIGS. 1-8B and 10 may be implemented in SOC 900 and, more specifically, the circuits and methods shown in FIGS. 1-8B and 10 may be implemented in SOC 900 or other chip to provide memory read and write functionality.

Figure 10:
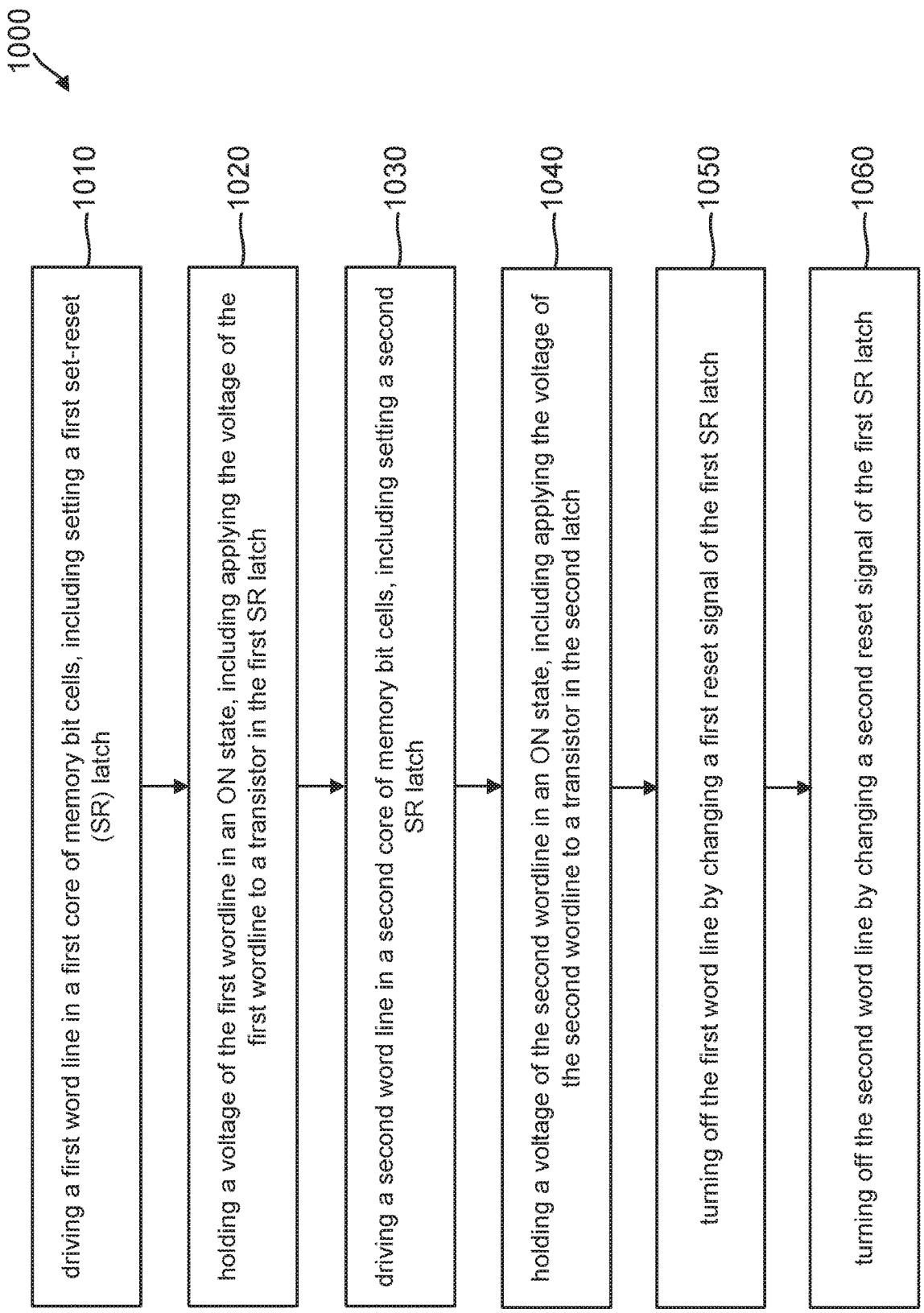
FIG. 10 is an illustration of a method of driving multiple wordlines, according to one implementation.

A flow diagram of an example method 1000 of operating one or multiple row decoders is illustrated in FIG. 10. In one example, method 1000 is performed by the circuits shown in FIGS. 1, 2, 4, and 6-7. In some examples, a memory management unit either within or outside of a CPU or GPU includes processing circuitry that executes computer readable instructions to perform a read or write operation on a RAM memory unit or a ROM memory unit by controlling a GBC (e.g., GBC 120 of FIGS. 1 and 4). For instance, logic in a CPU or a GPU may send address and control signals to a GBC to cause the GBC to either read or write data.

At action 1010, the method includes driving a first wordline in a first core of memory bit cells. For instance, a first wordline in a first core of memory bit cells may include a wordline having any appropriate index (e.g., 0, 1, or other) in a core of memory bit cells, such as memory core 101 of FIG. 1. Action 1010 also includes setting a first SR latch. An example is shown in FIG. 3, in which the set signal clkd_m0<0> is pulsed to cause the wordline w1_m0<0> to turn on. Another example is shown in FIG. 7, in which the set signal clkd_m0<0> is pulsed to cause the wordline w1_m0<0> to turn on.

At action 1020, the voltage of the wordline is held in an on state. For instance, the voltage of the wordline may be held in the on state for the remainder of the read or write operation, even continuing into a read or write operation on a time-sharing core of the same memory device. Action 1020 may include applying the voltage of the wordline to a transistor in the first SR latch. An example is shown in FIG. 2, in which transistor 211 is gate-coupled to the wordline and is turned on upon a high voltage of the wordline, thereby pulling down an input to an inverter.

At action 1030, the method includes driving a second wordline in a second core of memory bit cells. In the example of FIG. 1, it may be a wordline having a same or a different index as the first wordline, and it may occur in the other memory core, such as memory core 102. Action 1030 may further include setting a second SR latch. An example is shown in FIG. 3, in which the set signal clkd_m1<0> is pulsed to cause the wordline w1_m1<0> to turn on. Another example is shown in FIG. 7, in which the set signal clkd_m1<7> is pulsed to cause the wordline w1_m1<511> to turn on. The example of FIG. 2 shows wordlines with the same index being turned on, whereas the example of FIG. 7 shows wordlines with different index is being turned on.

At action 1040, the second wordline may be held in the on-state by applying a voltage of the second wordline to a transistor in the second SR latch. Action 1040 is similar to action 1020 but occurs at the second wordline and second SR latch.

At action 1050, the first wordline is turned off by changing a first reset signal of the first SR latch. In the example of FIG. 2, the reset signal rst_m0 is an active low signal that is provided to a gate of a PMOS transistor. In this instance, action 1050 may include changing the reset signal from a high to a low, thereby turning on pull-up transistor 210. Of course, while the present example discusses use of the PMOS transistor and an active low signal, other implementations may use an active high signal and an NMOS transistor.

Action 1060 is similar to action 1050. The second wordline is turned off by changing a second reset signal of the second SR latch. In the example of FIG. 2, an active low reset signal is changed from a high value to a low value to turn on a PMOS pull-down transistor. In the example of FIG. 7, the reset signal rst_n_m1 is changed from a high value to a low value to turn on a PMOS pull-down transistor.

Looking at actions 1050 and 1060, together they turn off two different wordlines, in two different memory cores, that were driven within a same clock cycle. In other words, the two different wordlines were turned on and then turned off within overlapping periods (i.e., the wordline in the first core being turned on first, and the wordline and the second core being turned on second while the wordline in the first core is still on, and the wordline in the first core being turned off first while the wordline in the second core is still turned on).

The scope of implementations is not limited to the specific actions shown in FIG. 10. Rather, other implementations may add, omit, rearrange, or modify one or more the actions. In one example, an implementation may repeat actions 1010-1060 each clock cycle or, at least, in subsequent non-consecutive cycles. The actions 1010-1060 may be performed as many times as appropriate to read or write requested data. When a wordline is driven, it allows a byte of data to be read from memory, where that byte of data is either written to or read from a physical location in the memory device corresponding to a logical location that is known to a CPU, GPU, or other processing device. Multiple clock cycles may be used to read or write multiple bytes of data with as many clock cycles used as appropriate for the size of the read or write request.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A memory device comprising:
   a first core of memory bitcells;
   a second core of memory bitcells;
   pre-decoding circuitry shared by the first core and the second core; and
   a row decoder coupled to the pre-decoding circuitry, the first core, and the second core, the row decoder including a first set-reset (SR) latch coupled to a first wordline of the first core via a first inverter and a second SR latch coupled to a second wordline of the second core via a second inverter,
   wherein the first SR latch includes:
      a first transistor that is gate-coupled to the first wordline and disposed between VDD and an input of the first inverter, and
      a second transistor that is gate-coupled to the first wordline and disposed between ground and the input of the first inverter.

2. The memory device of claim 1, wherein:
   the second transistor is drain-coupled to the input of the first inverter.

3. The memory device of claim 2, wherein:
   a third transistor of the second SR latch is gate-coupled to the second wordline and drain-coupled to an input of the second inverter.

4. The memory device of claim 1, wherein the second transistor comprises a negative channel metal oxide semiconductor (NMOS) device.

5. The memory device of claim 1, wherein the first SR latch comprises:
   a first pull-up transistor coupled to the first wordline through the first inverter, wherein the first pull-up transistor is gate-coupled to a first reset signal.

6. The memory device of claim 5, wherein the first pull-up transistor comprises a positive channel metal oxide semiconductor (PMOS) device.

7. The memory device of claim 1, wherein the first SR latch comprises:
   a first pull-down transistor that is gate-coupled to a first set signal.

8. The memory device of claim 7, wherein the first pull-down transistor comprises a negative channel metal oxide semiconductor (NMOS) device.

9. The memory device of claim 1, wherein the first transistor comprises a positive channel metal oxide semiconductor (PMOS) device.

10. The memory device of claim 1, wherein the first SR latch comprises:
    a first positive channel metal oxide semiconductor (PMOS) transistor gate coupled to an output of a NOR gate and further coupled to the first wordline through the first inverter.

11. The memory device of claim 1, wherein the first SR latch comprises:
    a first negative channel metal oxide semiconductor (NMOS) transistor gate coupled to an output of a NOR gate and further coupled to the first wordline through the first inverter and further being drain-coupled to the second transistor.

12. The memory device of claim 1, wherein the first SR latch comprises:
    a first positive channel metal oxide semiconductor (PMOS) transistor gate coupled to a first set signal and further coupled to the first wordline through the first inverter and source-coupled to the first transistor.

13. The memory device of claim 1, wherein the first SR latch comprises:
    a first negative channel metal oxide semiconductor (NMOS) transistor gate coupled to a first reset signal and further coupled to ground and drain-coupled to the second transistor.

14. The memory device of claim 1, wherein the first SR latch includes a first plurality of cross-coupled NOR gates.

15. A method performed in a time-sharing memory architecture, the method comprising:
    driving a first wordline in a first core of memory bit cells, including setting a first set-reset (SR) latch by using a first set signal;
    holding a voltage of the first wordline in an ON state, including applying the voltage of the first wordline to a gate of a first transistor in the first SR latch, wherein the first transistor is drain-coupled to an input of a first inverter, and wherein the first SR latch is coupled to the first wordline through the first inverter;
    driving a second wordline in a second core of memory bit cells, including setting a second SR latch by using a second set signal;
    holding a voltage of the second wordline in the ON state, including applying the voltage of the second wordline to a gate of a second transistor in the second SR latch, wherein the second transistor is drain-coupled to an input of a second inverter, and wherein the second SR latch is coupled to the second wordline through the second inverter; and
    subsequent to driving the first wordline, turning off the first wordline by changing a first reset signal of the first SR latch.

16. The method of claim 15, further comprising:
    subsequent to driving the second wordline, turning off the second wordline by changing a second reset signal of the second SR latch.

17. The method of claim 15, further comprising:
    removing the first set signal subsequent to the first wordline attaining the ON state.

18. The method of claim 15, further comprising:
    removing the second set signal subsequent to the second wordline attaining the ON state.

19. The method of claim 15, wherein the first reset signal comprises an active low signal.

20. A system on chip (SOC) comprising:
    a time-sharing memory device having a first core of memory bitcells and a second core of memory bitcells;
    means for converting address bits into pre-decoded signals; and
    means for receiving the pre-decoded signals and for accessing data in the time-sharing memory device according to the pre-decoded signals, the receiving means comprising an array of row decoders, each row decoder in the array having a first set-reset (SR) latch coupled to the first core and a second SR latch coupled to the second core,
    wherein a first row decoder in the array comprises: an inverter coupled to a wordline, and wherein a respective first SR latch includes:
       a first transistor that is gate-coupled to the wordline and disposed between VDD and an input of the inverter, and
       a second transistor that is gate-coupled to the wordline and disposed between ground and the input of the inverter.

21. The SOC of claim 20, wherein the receiving means comprises a plurality of NOR gates, each NOR gate of the plurality of NOR gates disposed at a respective SR latch input and coupled to the converting means.

22. The SOC of claim 20, wherein the first row decoder in the array comprises: a first pull-up transistor coupled to the input of the inverter and to a power rail and the second transistor.

23. The SOC of claim 20, wherein the first row decoder in the array comprises an arrangement of cross-coupled NOR gates.

24. A system on chip (SOC) comprising:
a first core of memory bitcells;
a second core of memory bitcells; and
a plurality of row decoders shared by the first core and the second core, wherein a first row decoder of the plurality of row decoders includes a first set-reset (SR) latch coupled to a first wordline of the first core via a first inverter and a second SR latch coupled to a second wordline of the second core via a second inverter, wherein the first SR latch includes:
  a first transistor that is gate-coupled to the first wordline and disposed between a power rail and an input of the first inverter, and
  a second transistor that is gate-coupled to the first wordline and disposed between ground and the input of the first inverter.

25. The SOC of claim 24, wherein the first row decoder comprises: a first pull-up transistor coupled to an input of the first inverter and to the power rail,
and wherein a second row decoder of the plurality of row decoders comprises: a second pull-up transistor coupled to an input of the second inverter and to the power rail, and a third transistor gate-coupled to the second wordline and disposed between the power rail and an input of the second inverter.

26. The SOC of claim 25, wherein the second transistor comprises a negative channel metal oxide semiconductor (NMOS) device coupling the input of the first inverter to ground.

27. The SOC of claim 25, wherein the first pull-up transistor is gate-coupled to a first reset signal.

28. The SOC of claim 27, wherein the first pull-up transistor comprises a positive channel metal oxide semiconductor (PMOS) device.

* * * * *